(12) United States Patent
Okumura et al.

(10) Patent No.: US 7,495,301 B2
(45) Date of Patent: Feb. 24, 2009

(54) THIN FILM ACCELEROMETER

(75) Inventors: Mika Okumura, Tokyo (JP); Makio Horikawa, Tokyo (JP); Kimitoshi Satou, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 21 days.

(21) Appl. No.: 11/276,338

(22) Filed: Feb. 24, 2006

(65) Prior Publication Data
US 2007/0031638 A1    Feb. 8, 2007

(30) Foreign Application Priority Data
Aug. 8, 2005    (JP) .............. 2005-229886

(51) Int. Cl.
*H01L 29/84*    (2006.01)
*H01L 41/113*    (2006.01)

(52) U.S. Cl. .......................... 257/417; 438/50
(58) Field of Classification Search ................ 257/417; 438/50; *H01L 29/84*
See application file for complete search history.

(56) References Cited

U.S. PATENT DOCUMENTS

| | | | | |
|---|---|---|---|---|
| 5,576,250 A | * | 11/1996 | Diem et al. ............. | 438/50 |
| 5,719,073 A | * | 2/1998 | Shaw et al. ............. | 438/53 |
| 5,922,212 A | * | 7/1999 | Kano et al. ............. | 216/2 |
| 6,078,016 A | * | 6/2000 | Yoshikawa et al. ......... | 200/181 |
| 6,199,874 B1 | * | 3/2001 | Galvin et al. ............. | 280/5.514 |
| 6,244,112 B1 | * | 6/2001 | Fujii ....................... | 73/514.32 |
| 6,388,300 B1 | * | 5/2002 | Kano et al. ............. | 257/419 |
| 6,514,786 B1 | * | 2/2003 | Yamaguchi et al. ......... | 438/48 |
| 2006/0180882 A1 | * | 8/2006 | Sato et al. ............. | 257/414 |

FOREIGN PATENT DOCUMENTS

| | | |
|---|---|---|
| DE | 693 05 955 | 6/1997 |
| DE | 693 18 956 | 12/1998 |
| DE | 198 20 816 | 11/1999 |
| DE | 693 33 551 | 6/2005 |
| JP | 9-211022 | 8/1997 |
| WO | WO 2006127776 A1 * | 11/2006 |

OTHER PUBLICATIONS

Bustillo et al. "Surface Micromachining for Microelectromechanical Systems." Proceedings of the IEEE, vol. 86, No. 4. Aug. 1998.*
Warneke at al. "Monolithic Multiple Axis Accelerometer Design in Standard CMOS." Proc. SPIE, vol. 2642, pp. 95-102. 1995.*

* cited by examiner

*Primary Examiner*—Davienne Monbleau
*Assistant Examiner*—Christopher M Roland
(74) *Attorney, Agent, or Firm*—Oblon, Spivak, McClelland, Maier & Neustadt, P.C.

(57) ABSTRACT

A thin film structure including a conductive thin film provided on a substrate and configured to be displaced in response to an applied acceleration, a pair of electrode pads formed on the substrate such that the pair of electrode pads are disposed on respective sides of the thin film, and a nonconductive film covering a top surface of the thin film and the side of the thin film facing the electrode pads. A top surface of the conductive thin film being higher than top surfaces of the electrode pads.

7 Claims, 10 Drawing Sheets

THIN FILM ACCELEROMETER

BACKGROUND OF THE INVENTION

1. Field of the Invention

The present invention relates to a thin film structure and a manufacturing method therefor, and more particularly to a thin film structure for use in a semiconductor acceleration sensor and a manufacturing method therefor.

2. Background Art

Semiconductor acceleration sensors have been used in control systems for automobile suspensions, air bags, etc. For example, Japanese Patent Laid-Open No. Hei 9-211022 discloses a semiconductor acceleration sensor in which thin film structures such as stationary and movable electrodes are formed on a substrate.

In such an acceleration sensor, the main body including the thin film structures is enclosed in a hermetic package for protection. The stationary and movable electrodes are connected to the electrode pads, which are exposed outside the device.

SUMMARY OF THE INVENTION

The above conventional acceleration sensor is disadvantageous in that if a gap is formed between the package and the electrode pads as a result of detachment of the package from the pads due to external stress, etc., then moisture, etc. may enter the gap, resulting in formation of parasitic capacitance between the electrode pads. This causes the thin film structures to suffer electrical leakage and a change in their characteristics. Furthermore, the fringe effect around the electrodes adversely affects the device characteristics.

The present invention has been devised in view of the above problems. It is, therefore, an object of the present invention to provide a thin film structure for use in a semiconductor acceleration sensor housed in a protective package and a manufacturing method therefor, wherein the thin film structure has an electrode structure capable of reducing the parasitic capacitance between the electrode pads to prevent a change in the characteristics, as well as canceling the fringe effect.

BEST MODE FOR CARRYING OUT THE INVENTION

Now, embodiments of the present invention will be described with reference to the drawings. Like reference numerals denote like components throughout the drawings, and redundant descriptions will be omitted.

First Embodiment

Figure 1:
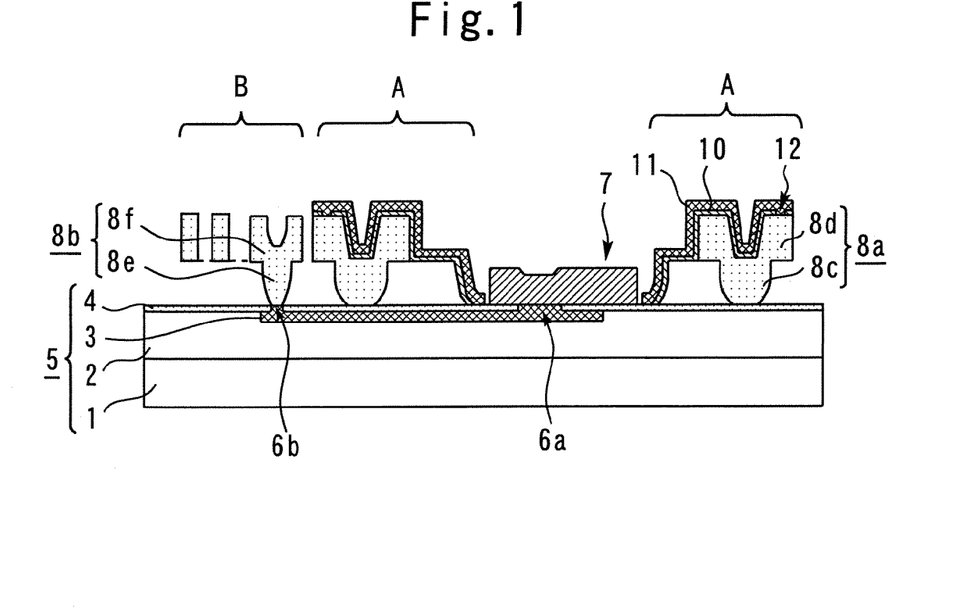
FIG. 1 is a cross-sectional view showing a thin film structure of the first embodiment.

FIG. 1 shows a cross-sectional view of a thin film structure according to a first embodiment of the present invention. This thin film structure is used in a semiconductor acceleration sensor, etc. A first insulating film 2 is provided on a silicon substrate 1. A conductive wire 3 is buried in the surface of the first insulating film 2. There is no difference in height between the top surface of the first insulating film 2 and the top surface of the wire 3; that is, the overall top surface is substantially flat. A second insulating film 4 is provided on the first insulating film 2 and the wire 3. The second insulating film 4 is formed of a silicon nitride film. (The term "substrate 5" is hereinafter used to refer to the film stack made up of the silicon substrate 1, the first insulating film 2, the wire 3, and the second insulating film 4.) Holes 6a and 6b are formed so as to penetrate the second insulating film 4 on the surface of the wire 3. A conductive electrode pad 7 is formed on the substrate 5 such that it is located over the hole 6a. The electrode pad 7 is connected to the wire 3 through the hole 6a.

The portions denoted by reference numeral A in the figure adjacent to both sides of the electrode pad 7 are hereinafter referred to as "proximal portions A". The portion denoted by reference numeral B outside the proximal portions A is hereinafter referred to as "nonproximal portion B". Each proximal portion A includes a thin film 8a. The thin film 8a is electrically conductive and is made up of a support portion 8c and a floating portion 8d. The support portion 8c is formed on the second insulating film 4. The floating portion 8d is supported on the support portion 8c and thereby spaced a predetermined distance apart from the second insulating film 4. The top surface of the floating portion 8d, that is, the top surface of the thin film 8a, is higher than the top surface of the electrode pad 7.

The nonproximal portion B includes a thin film 8b. The thin film 8b is electrically conductive and is made up of a support portion 8e and a floating portion 8f. The support portion 8e is formed over the hole 6b and connected to the wire 3. The floating portion 8f is supported on the support portion 8e and thereby spaced a predetermined distance apart from the second insulating film 4. Thus, the thin films 8a and 8b are electrically conductive and have a structure that allows them to be displaced in response to an applied acceleration.

A third insulating film 10 is formed on the top surface of each floating portion 8d and on the side of each floating portion 8d closest to the electrode pad 7. This film is made up of, for example, a silicon nitride film. A shielding film 11 is laminated over the third insulating film 10. This film is, for example, an undoped polysilicon film (a nonconductive film). Holes 12 are formed so as to penetrate the third insulating film 10 on the top surfaces of the respective floating portions 8d. The shielding film 11 is connected to the thin films 8a through the holes 12. Thus, the shielding film 11 covers the top surface of each thin film 8a and the side of each thin film 8a facing the electrode pad 7.

The above third insulating film 10 is a diffusion blocking film for preventing diffusion of conductive substances (i.e., impurities contained in the thin films 8a) from the thin films 8a into the shielding film 11. Further, the holes 12 are used to prevent the shielding film 11 from becoming detached from the thin films 8a during the process of manufacturing the thin film structure.

Though not shown in FIG. 1, there are actually a plurality of electrode pads 7 formed on the substrate 5. Specifically, two electrode pads 7 are disposed on respective sides of each thin film 8a. That is, on the substrate 5, each thin film 8a is sandwiched between a pair of electrode pads 7. Sides of each electrode pad 7 faces the shielding film 11. The top surface of the shielding film 11 is higher than the top surfaces of the electrode pads 7.

This configuration allows the parasitic capacitance between adjacent electrode pads to be reduced even when moisture, etc. enters between the package and the electrode pads. Therefore, it is possible to cancel the fringe effect between adjacent electrode pads and thereby prevent a change in the characteristics.

There will now be described a method for manufacturing the thin film structure shown in FIG. 1.

Figure 2:
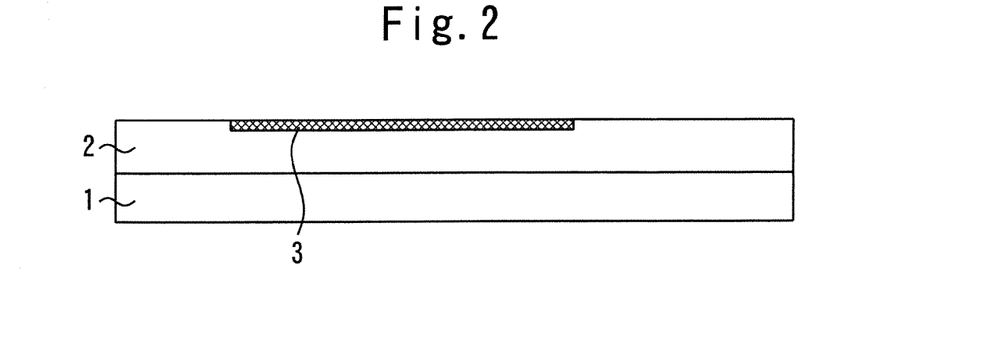
FIG. 2 is a cross-sectional view showing a manufacturing method of a thin film structure of the first embodiment.

First of all, a first insulating film made up of a silicon oxide film is formed on a silicon substrate. Then, the surface of the first insulating film is selectively etched to form a groove. After that, a metal film made of tungsten, etc. is formed on the entire surface so as to fill the groove. Then, unwanted portions of the metal film are removed, leaving only the portion of the metal film in the groove. The resultant structure is such that the first insulating film 2 is formed on the silicon substrate 1, and the conductive wire 3 is formed on the surface of the first insulating film 2, as shown in FIG. 2. There is substantially no difference in height between the top surface of the first insulating film 2 and the top surface of the wire 3; that is, the overall top surface is flat.

Figure 3:
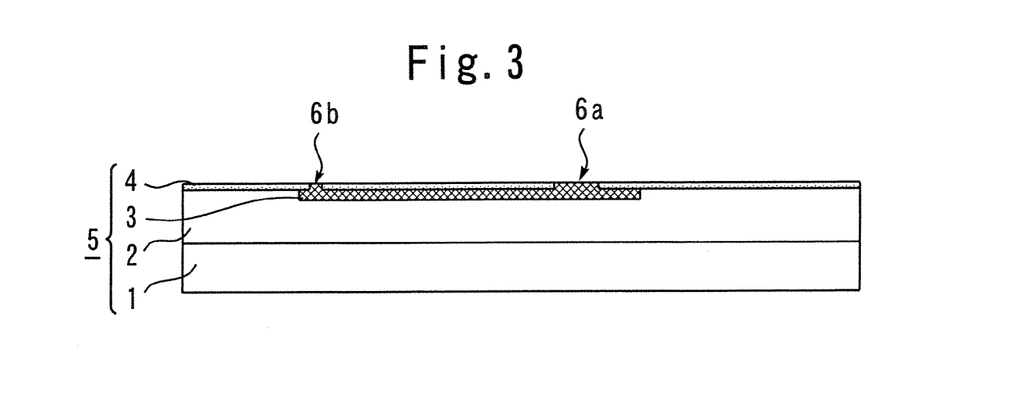
FIG. 3 is a cross-sectional view showing a manufacturing method of a thin film structure of the first embodiment.

Then, a silicon nitride film is formed on the exposed surfaces of the first insulating film 2 and the wire 3 shown in FIG. 2. As a result, the second insulating film 4 is formed on the first insulating film 2 and the wire 3, as shown in FIG. 3. Thus, the substrate 5 is formed, in which the first insulating film 2, the wire 3, and the second insulating film 4 are laminated to one another over the silicon substrate 1.

Then, the second insulating film 4 on the wire 3 is selectively etched to form the holes 6a and 6b on the wire 3, as shown in FIG. 3.

Figure 4:
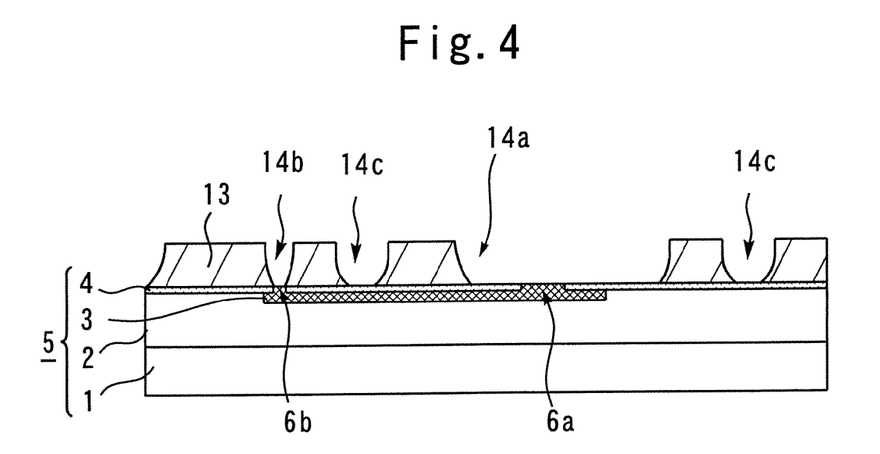
FIG. 4 is a cross-sectional view showing a manufacturing method of a thin film structure of the first embodiment.

Then, a silicon oxide film is formed on the entire surface of the second insulating film 4 shown in FIG. 3. After that, the silicon oxide film is selectively etched to form a sacrificial film 13 on the second insulating film 4, as shown in FIG. 4. The sacrificial film 13 has groove patterns 14a, 14b and 14c formed therein. It should be noted that the second insulating film 4 and the hole 6a are exposed at the bottom surface of the groove 14a. Further, the hole 6b is exposed at the bottom surface of the groove pattern 14b, and the second insulating film 4 is also exposed at the bottom surface of the groove pattern 14c.

Figure 5:
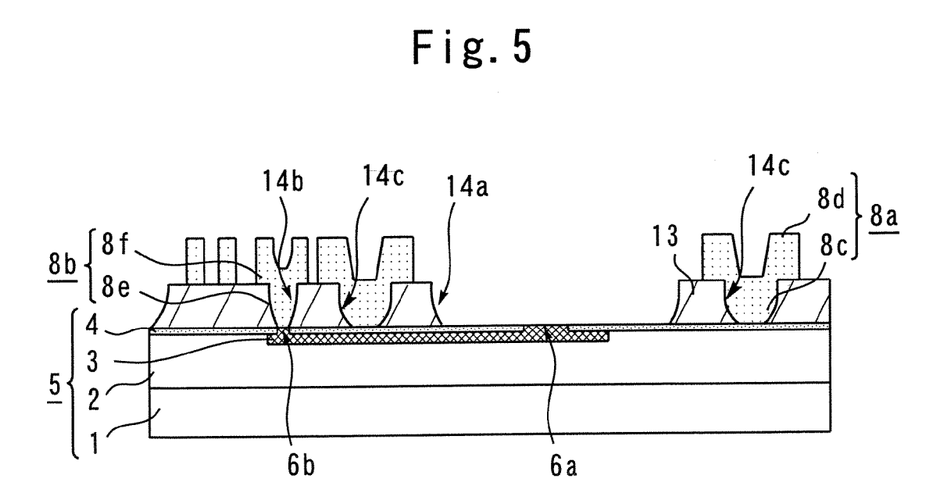
FIG. 5 is a cross-sectional view showing a manufacturing method of a thin film structure of the first embodiment.

Then, a silicon film containing impurities is formed on the entire surface so as to fill the groove patterns 14a, 14b, and 14c shown in FIG. 4. After that, the silicon film is selectively etched to form the support portions 8c within their respective groove patterns 14c and further form the floating portions 8d on their respective support portions 8c, as shown in FIG. 5. That is, the above step forms the conductive thin films 8a each made up of a support portion 8c and a floating portion 8d. Furthermore, the support portion 8e is formed within the groove pattern 14b, and the floating portion 8f is formed on the support portion 8e. That is, the above step also forms the conductive thin film 8b made up of the support portion 8e and the floating portion 8f.

Then, a third insulating film made up of a silicon nitride film is formed on the exposed surfaces of the sacrificial film 13 and the thin films 8a and 8b shown in FIG. 5. Then, the third insulating film is selectively etched to form the third insulating film 10 that covers the top surfaces of the floating portions 8d, the sides of the floating portions 8d closest to the groove pattern 14a, and the portions of the sacrificial film 13 constituting the sidewalls of the groove pattern 14a. Further, the holes 12 are formed so as to penetrate the third insulating film 10 on the respective floating portions 8d. It should be noted that the second insulating film 4 and the hole 6a are exposed at the bottom surface of the groove pattern 14a.

Figure 6:
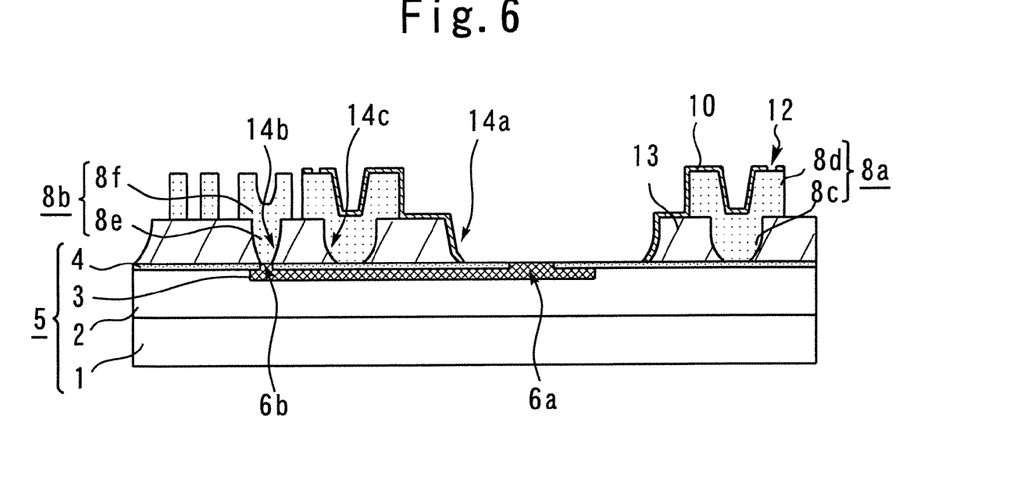
FIG. 6 is a cross-sectional view showing a manufacturing method of a thin film structure of the first embodiment.
Figure 7:
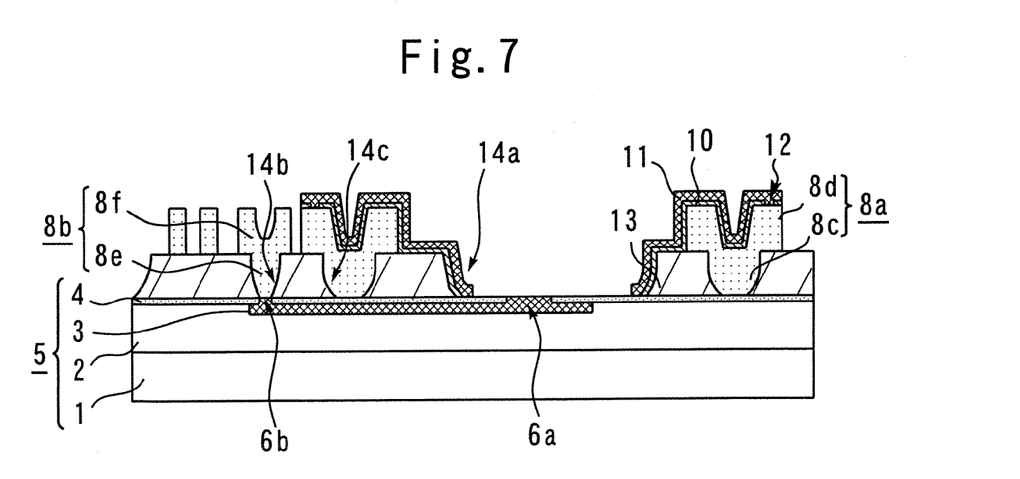
FIG. 7 is a cross-sectional view showing a manufacturing method of a thin film structure of the first embodiment.

Then, a shielding film made up of a polysilicon film (containing no impurities) is formed on the exposed surfaces of the sacrificial film 13 and the third insulating film 10 shown in FIG. 6. After that, the shielding film is selectively etched to form the shielding film 11 covering the third insulating film 10, as shown in FIG. 7. It should be noted that the above step forms the shielding film 11 such that it is connected to the thin films 8a through the holes 12. Thus, the shielding film 11 is formed so as to cover the top and side surfaces of the thin films 8a.

Then, the entire sacrificial film 13 shown in FIG. 7 is removed using hydrofluoric acid, etc. As described above, the shielding film 11 has been formed so as to be connected to the thin films 8a through the holes 12. Since the shielding film 11 is a polysilicon film and hence insoluble in hydrofluoric acid, it is not detached from the second insulating film 4. Further, since the shielding film 11 is connected to the thin films 8a through the holes 12, lift-off of the thin films 8a is prevented. Still further, since the third insulating film 10 is a silicon nitride film and hence insoluble in hydrofluoric acid, lift-off of the third insulating film 10 from the second insulating film 4 is prevented.

Then, a metal film made of aluminum is formed on the entire surface so as to fill the groove pattern 14a shown in FIG. 7. After that, the metal film is selectively etched to form the electrode pad 7 over the hole 6a, as shown in FIG. 1. It should be noted that the top surface of the electrode pad 7 is lower than the top surface of the shielding film 11.

The above-described manufacturing method allows one to form a thin film structure in which the parasitic capacitance between adjacent electrode pads is reduced.

A variation of the above manufacturing method will be described below.

In the above manufacturing method, the step of forming the electrode pad 7 (see FIG. 1) is performed after the step of forming the shielding film 11 (see FIG. 7). However, the electrode pad 7 may be formed before forming the shielding film 11.

Specifically, this method begins by performing the above sequence of steps from the step of forming the first insulating film 2 (see FIG. 2) to the step of forming the third insulating film 10 (see FIG. 6). Then, though not shown, on the substrate 5 a pair of electrode pads are formed on respective sides of each thin film 8a. After that, the third insulating film and the shielding film are formed so as to cover the thin films 8a. At that time, holes are also formed. The remaining steps are similar to those of the above original manufacturing method.

This variation also allows one to form a thin film structure in which the parasitic capacitance between adjacent electrode pads is reduced.

Second Embodiment

Figure 8:
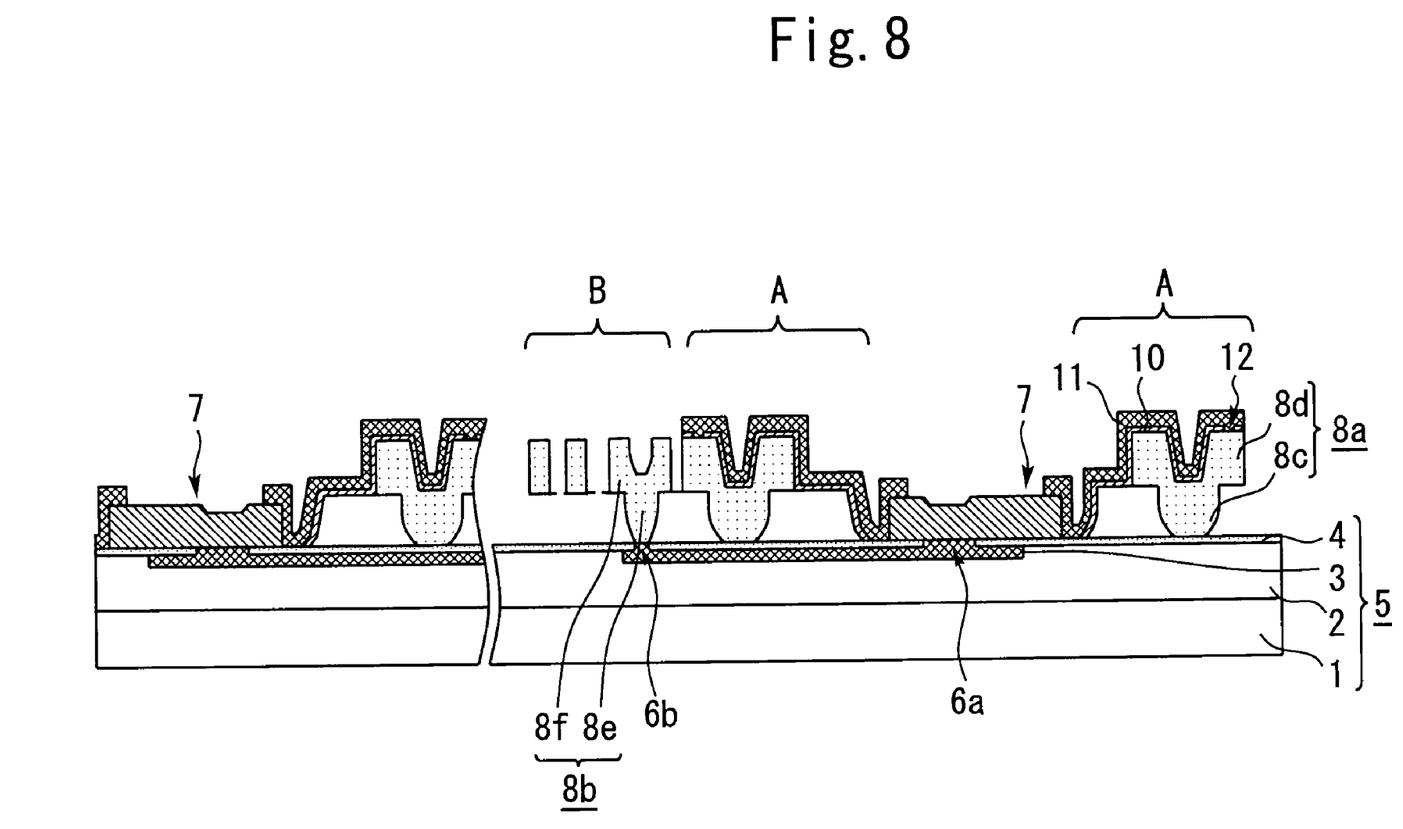
FIG. 8 is a cross-sectional view showing a thin film structure of the second embodiment.

FIG. 8 shows a cross-sectional view of a thin film structure according to a second embodiment of the present invention. It should be noted that the following description focuses on the differences of the present embodiment as compared to the first embodiment. In the thin film structure of the present embodiment, the shielding film 11 covers the sides and the top edge portions of the electrode pad 7 in addition to the surfaces of the third insulating film 10. Except for this feature, the thin film structure of the present embodiment is configured in the same manner as the thin film structure of the first embodiment, and therefore no further description will be provided.

Thus, according to the present embodiment, the shielding film 11 is formed so as to cover the sides and the top edge portions of the electrode pad 7. Therefore, the present embodiment can reduce the parasitic capacitance between adjacent electrode pads even further than the first embodiment. This allows one to more effectively cancel the fringe effect between adjacent electrode pads, thereby preventing a change in the characteristics.

There will now be described a method for manufacturing the thin film structure of the present embodiment.

This method begins by performing the above sequence of steps from the step of forming the first insulating film 2 on the silicon substrate 1 (see FIG. 2) to the step of forming the third insulating film 10 (see FIG. 6), as in the first embodiment. Then, the electrode pad 7 is formed within the groove 14a shown in FIG. 6 such that it is disposed over the hole 6a, producing the structure shown in FIG. 9.

Figure 9:
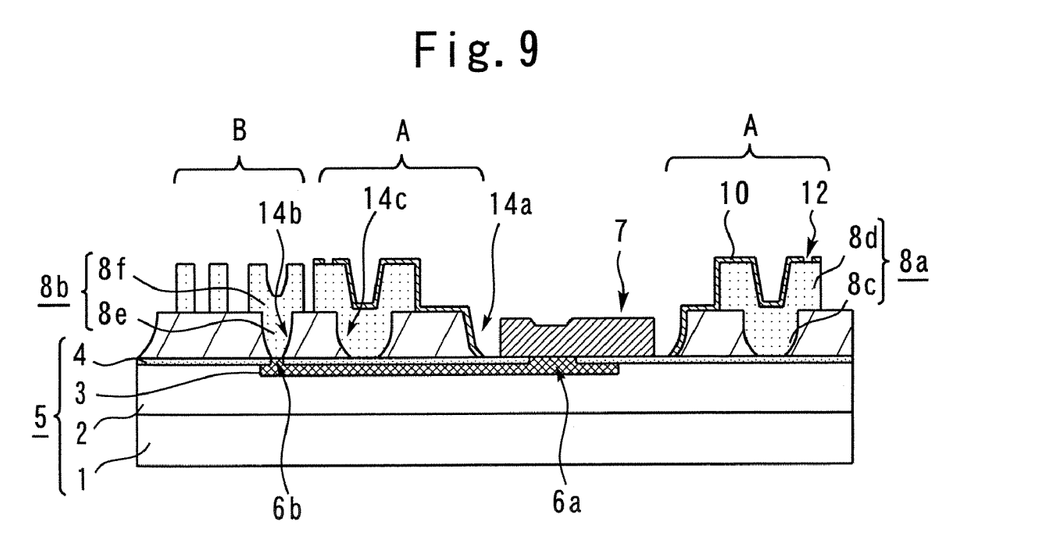
FIG. 9 is a cross-sectional view showing a manufacturing method of a thin film structure of the second embodiment.
Figure 10:
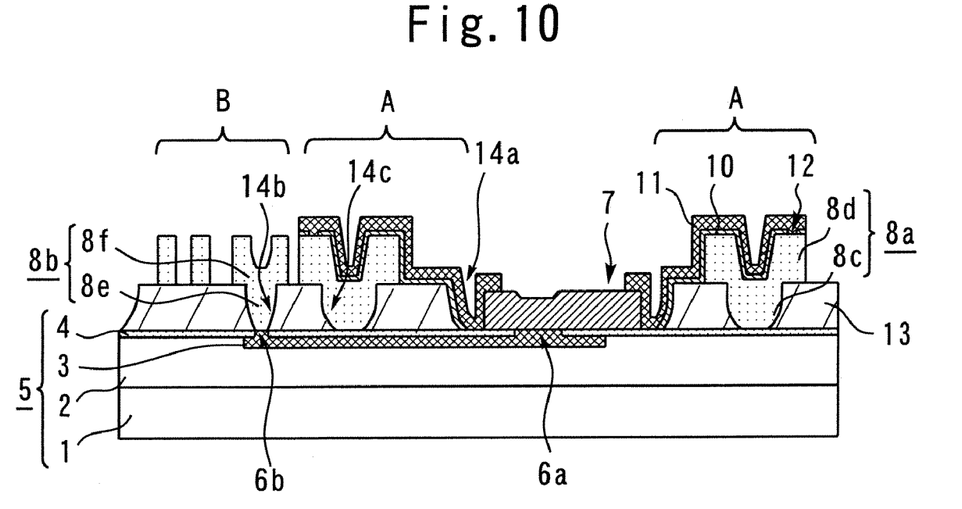
FIG. 10 is a cross-sectional view showing a manufacturing method of a thin film structure of the second embodiment.

Then, a shielding film is formed so as to cover the third insulating film 10, the groove pattern 14a, and the sides and the top edge portions of the electrode pad 7 shown in FIG. 9, producing the structure shown in FIG. 10. After that, the entire sacrificial film 13 shown in FIG. 10 is removed, producing the structure shown in FIG. 8.

Thus, in the above manufacturing method of the present embodiment, the shielding film 11 is formed so as to cover the sides and the top edge portions of the electrode pad 7. Except for this feature, this method is similar to the above variation of the manufacturing method of the first embodiment.

The manufacturing method of the present embodiment can form a thin film structure in which the parasitic capacitance between adjacent electrode pads is further reduced, as compared to the first embodiment.

Third Embodiment

Figure 11:
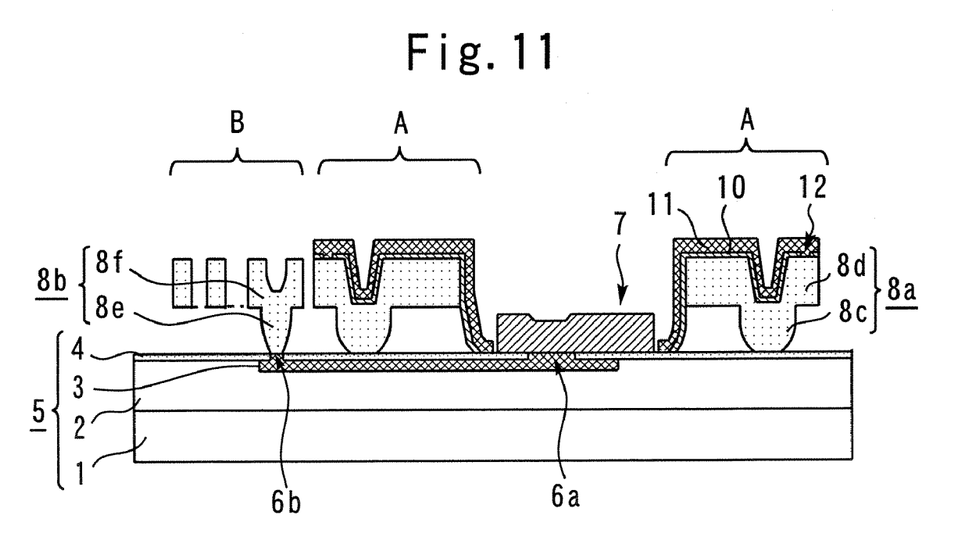
FIG. 11 is a cross-sectional view showing a thin film structure of the third embodiment.

FIG. 11 shows a cross-sectional view of a thin film structure according to a third embodiment of the present invention. It should be noted that the following description focuses on the differences of the present embodiment as compared to the first embodiment.

In the thin film structure of the present embodiment, the edge of the floating portion 8d of each proximal portion A is extended toward the electrode pad 7 side such that the side of the floating portion 8d facing the electrode pad 7 is as close to the electrode pad 7 as possible. In other words, each thin film 8a and the electrode pad 7 are formed such that they are spaced apart by the smallest possible spacing determined by the patterning accuracy.

Specifically, the lithography and etching at the steps of forming the thin films 8a and forming the electrode pad 7 are performed such that the thin films 8a and the electrode pad 7 are formed as close to each other as possible as long as there is no possibility that they come into contact with each other.

At that time, the portions of the shielding film 11 facing the sides of the electrode pad 7 are formed such that their top surfaces are higher than the top surface of the electrode pad 7. Except for these features, the thin film structure of the present embodiment is configured in the same manner as the thin film structure of the first embodiment, and therefore no further description will be provided.

Thus, the present embodiment provides a structure in which the portions of the shielding film 11 close to the electrode pad 7 has a large height, as compared to the first embodiment. Therefore, the present embodiment can reduce the parasitic capacitance between adjacent electrode pads even further than the first embodiment. This allows one to more effectively cancel the fringe effect between adjacent electrode pads and prevent a change in the characteristics.

Fourth Embodiment

Figure 12:
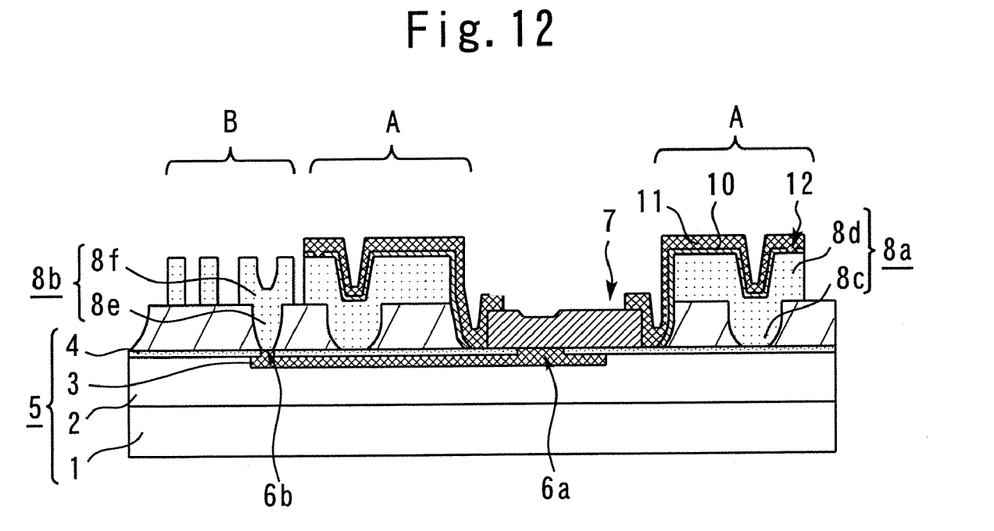
FIG. 12 is a cross-sectional view showing a thin film structure of the fourth embodiment.

FIG. 12 shows a cross-sectional view of a thin film structure according to a fourth embodiment of the present invention. It should be noted that the following description focuses on the differences of the present embodiment as compared to the third embodiment.

In the thin film structure of the present embodiment, the shielding film 11 covers the sides and the top edge portions of the electrode pad 7 in addition to the exposed surfaces of the third thin insulating film 10. Except for this feature, the thin film structure of the present embodiment is configured in the same manner as the thin film structure of the third embodiment, and therefore no further description will be provided.

The above thin film structure of the present embodiment can reduce the parasitic capacitance between adjacent electrode pads even further than the thin film structure of the third embodiment shown in FIG. 11. This allows one to more effectively cancel the fringe effect between adjacent electrode pads and prevent a change in the characteristics.

Fifth Embodiment

Figure 13:
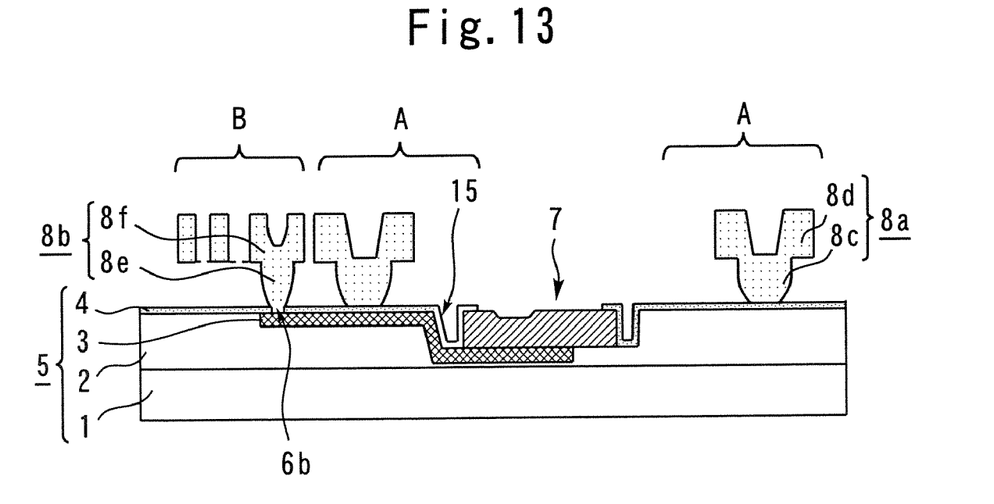
FIG. 13 is a cross-sectional view showing a thin film structure of the fifth embodiment.

FIG. 13 shows a cross-sectional view of a thin film structure according to a fifth embodiment of the present invention. It should be noted that the following description focuses on the differences of the present embodiment as compared to the first to fourth embodiments.

In the thin film structure of the present embodiment, the electrode pad 7 is provided within a groove 15 formed in the surface of the first insulating film 2. The wire 3 is formed so as to extend along a side and the bottom surface of the groove 15. The top surface of the electrode pad 7 is level with or lower than the top surface of the substrate 5. Though not shown, actually, two grooves 15 are provided on respective sides of each thin films 8a. Each groove 15 is formed in the surface of the substrate 5 and has an electrode pad formed therein.

The second insulating film 4 is formed so as to cover the sides and the bottom surface of the groove 15 as well as the sides and the top edge portions of the electrode pad 7. The second insulating film 4 is a silicon nitride film. It should be noted that the thin film structure of the present embodiment does not include the third insulating film 10, the shielding film 11, and the hole 12 shown in FIG. 1 descried in connection with the first embodiment. Except for these features, the thin film structure of the present embodiment is configured in the same manner as the thin film structure of the first embodiment, and therefore no further description will be provided.

The thin film structure of the present embodiment allows the thin films 8a to be formed such that their height is greater than the height of the electrode pad 7. Further according to the present embodiment, the sides and the top edge portions of the electrode pad 7 are covered with the second insulating film 4. This configuration produces the same effect as the configuration of the second embodiment in which the sides and the top edge portions of the electrode pad 7 are covered with the shielding film (see FIG. 8). Therefore, the present embodiment can cancel the fringe effect between adjacent electrode pads and thereby prevent a change in the characteristics more effectively than the first embodiment.

There will now be described a method for manufacturing the thin film structure of the present embodiment.

Figure 14:
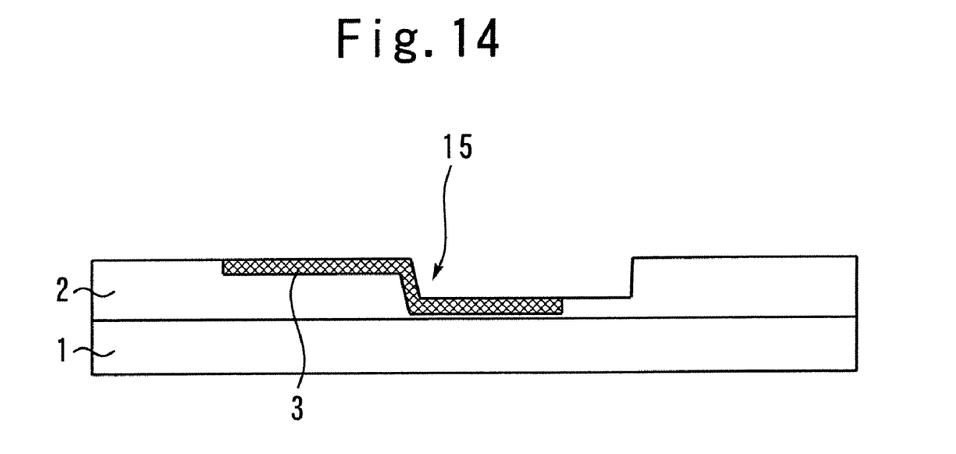
FIG. 14 is a cross-sectional view showing a manufacturing method of a thin film structure of the fifth embodiment.

First of all, a first insulating film is formed on a silicon substrate and then its surface is selectively etched to form a groove. Then, a wire is formed so as to extend along the surface of the first insulating film and a side and the bottom surface of the groove. FIG. 14 shows the resultant structure in which: the groove 15 is formed in the surface of the silicon substrate 1; and the wire 3 is formed so as to extend along the surface of the first insulating film 2 and a side and the bottom surface of the groove 15. Though not shown in FIG. 14, there are actually a plurality of grooves 15 formed in the surface of the substrate.

Figure 15:
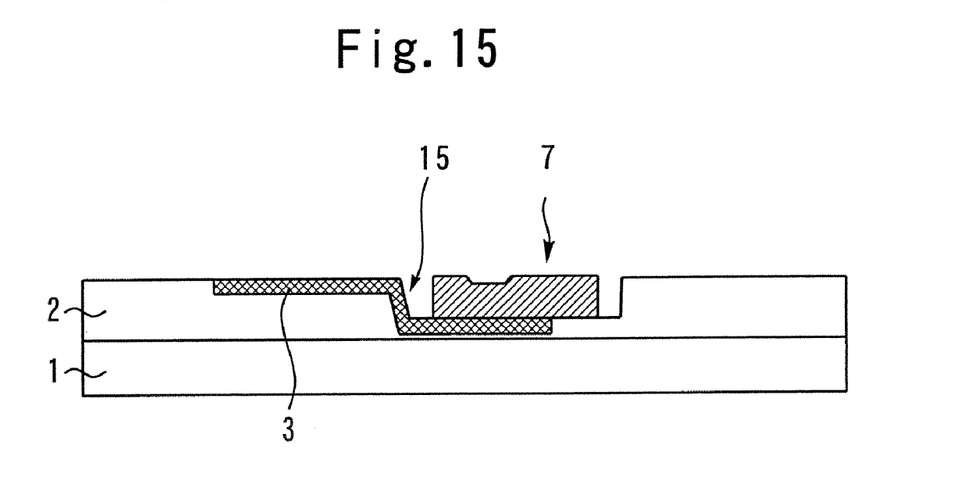
FIG. 15 is a cross-sectional view showing a manufacturing method of a thin film structure of the fifth embodiment.

Then, an electrode pad is formed within the groove 15 shown in FIG. 14. As a result, the electrode pad 7 is formed on the bottom surface of the groove 15, as shown in FIG. 15. The top surface of the electrode pad 7 is level with or lower than the top surface of the substrate 5 (see FIG. 13).

Figure 16:
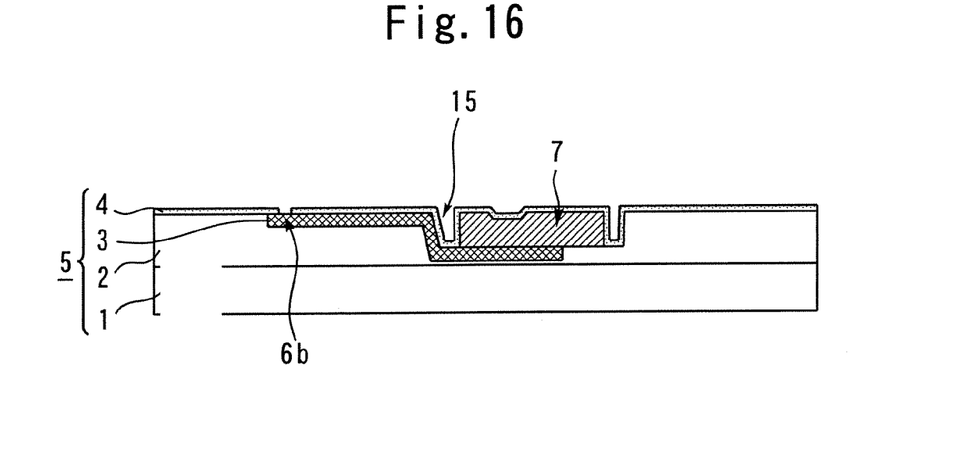
FIG. 16 is a cross-sectional view showing a manufacturing method of a thin film structure of the fifth embodiment.

Then, a silicon nitride film is formed on the exposed surfaces of the first insulating film 2, the wire 3, the groove 15, and the electrode pad 7 shown in FIG. 15. After that, the silicon nitride film is selectively etched to form the second insulating film 4 covering the first insulating film 2, the wire 3, the groove 15, and the electrode pad 7, as shown in FIG. 16. At that time, the hole 6b is formed so as to penetrate the second insulating film 4 on the wire 3 outside the groove 15.

Figure 17:
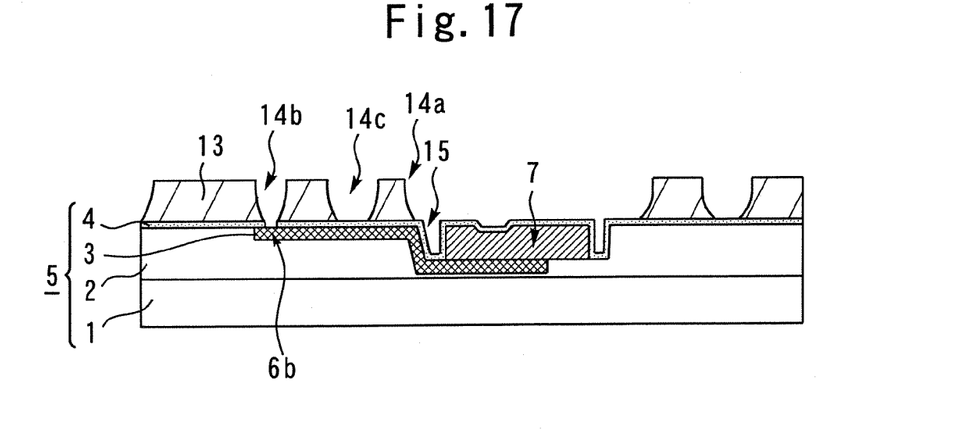
FIG. 17 is a cross-sectional view showing a manufacturing method of a thin film structure of the fifth embodiment.

Then, a silicon oxide film is formed on the entire surface of the second insulating film 4 shown in FIG. 16. After that, the silicon oxide film is selectively etched to form the groove pattern 14a, as shown in FIG. 17. Also at this step, the groove pattern 14b is formed over the hole 6b outside the groove 15, and the groove pattern 14c is formed on the second insulating film 4 outside the groove 15.

Then, a silicon film containing impurities is formed on the entire surface so as to fill the groove patterns 14a, 14b, and 14c shown in FIG. 17. After that, the silicon film is selectively etched. Then, the portion of the second insulating film 4 on the top surface of the electrode pad 7 is selectively removed, leaving the second insulating film 4 on the sides and the top edge portions of the electrode pad 7. Then, the entire sacrificial film 13 is removed, producing the structure shown in FIG. 13. Though not shown in FIG. 13, on the substrate 5 each thin film 8a is sandwiched between adjacent grooves 15.

Thus, the above manufacturing method covers the sides and the top edge portions of the electrode pad 7 with the second insulating film 4, thereby eliminating the steps of forming the third insulating film 10, the shielding film 11, and the hole 12 described in connection with the first embodiment. Therefore, the present embodiment requires fewer manufacturing steps than the first embodiment even though it can achieve the same effect as the first embodiment.

Sixth Embodiment

Figure 18:
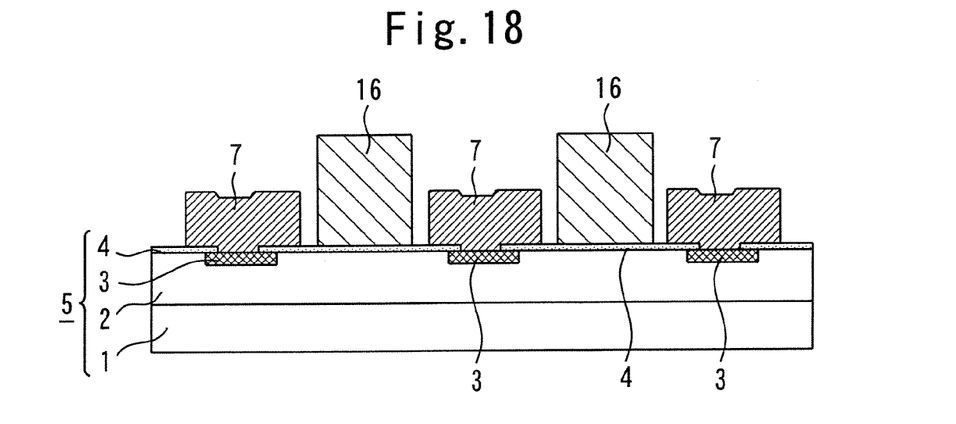
FIG. 18 is a cross-sectional view showing a thin film structure of the sixth embodiment.

FIG. 18 shows a cross-sectional view of a thin film structure according to a sixth embodiment of the present invention. The following description focuses on the differences of the present embodiment as compared to the first embodiment.

It should be noted that this figure does not show the thin film portions described in connection with the first to fifth embodiments. Referring to the figure, a plurality of electrode pads 7 are formed on the substrate 5, and shield patterns 16 are formed between adjacent electrode pads 7. The shield patterns 16 have a larger thickness than the electrode pads 7. That is, the top surfaces of the shield patterns 16 are higher than the top surfaces of the electrode pads 7. Each shield pattern is made up of a nonconductive film such as an insulating film (a silicon oxide film, etc.) or an undoped silicon film.

Except for these features, the thin film structure of the present embodiment is configured in the same manner as the thin film structure of the first embodiment, and therefore no further description will be provided.

Thus, the above thin film structure of the present embodiment allows one to reduce the parasitic capacitance between adjacent electrode pads by increasing the film thickness of the shield patterns 16. Therefore, the present embodiment can cancel the fringe effect between adjacent electrode pads more easily and hence prevent a change in the characteristics more effectively than the first embodiment.

Seventh Embodiment

Figure 19:
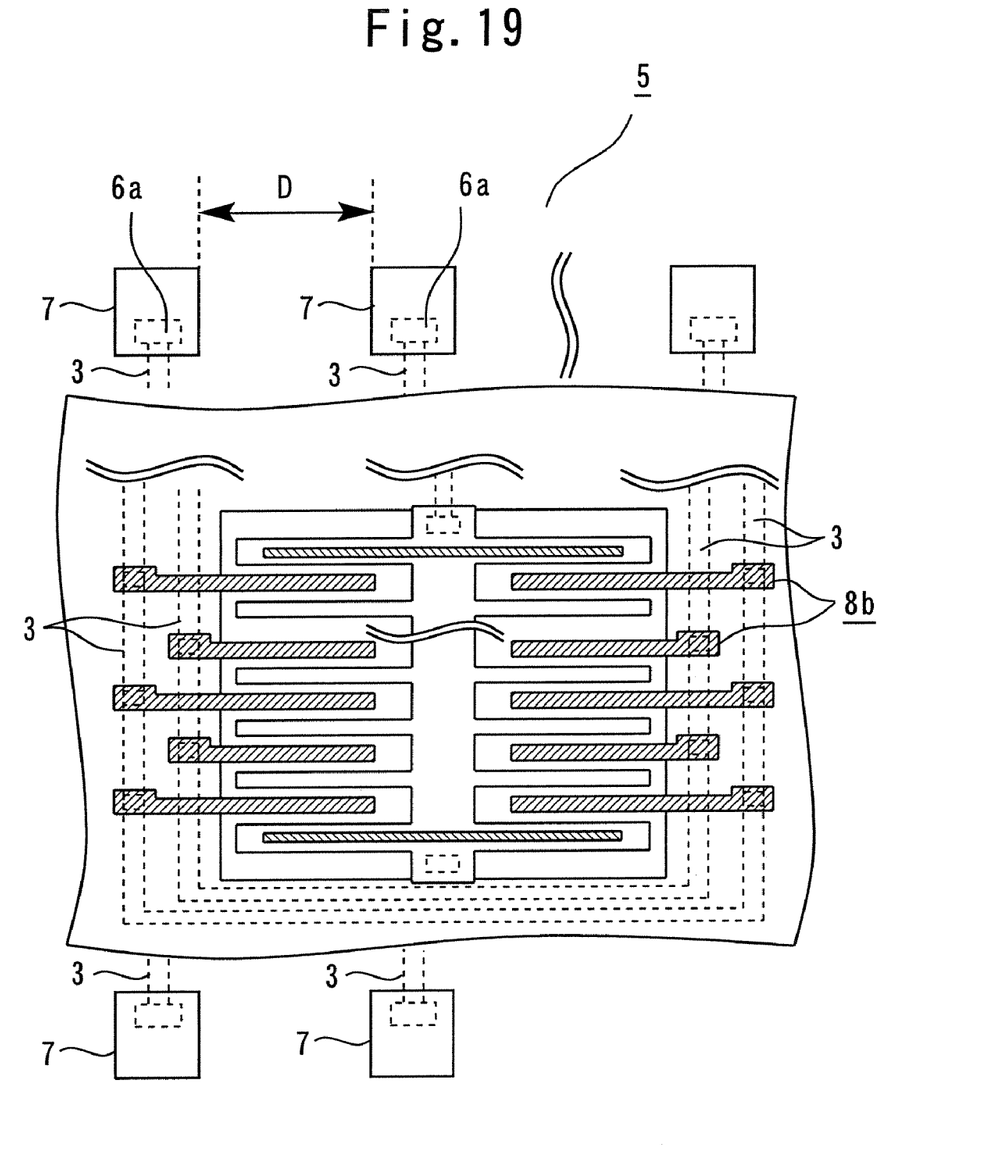
FIG. 19 is a cross-sectional view showing a thin film structure of the seventh embodiment.

FIG. 19 shows a plan view of a thin film structure according to a seventh embodiment of the present invention.

The present embodiment provides an arrangement in which adjacent electrode pads are spaced apart by the greatest possible spacing. This arrangement can be applied to any of the thin film structures of the first to sixth embodiments. For example, when three electrode pads 7 are to be arranged along an edge of the substrate 5, two of the electrodes 7 are disposed on opposing sides of the substrate 5 and the remaining one is disposed halfway between them. In this configuration, the distance D between adjacent electrode pads is preferably 200 μm or more. This allows the parasitic capacitance between adjacent electrode pads to be reduced.

The present embodiment allows the first to sixth embodiments to further reduce the parasitic capacitance between adjacent electrode pads. Therefore, it is possible to more effectively cancel the fringe effect between adjacent electrode pads and prevent a change in the characteristics.

The invention claimed is:

1. A thin film structure comprising:
    a conductive thin film provided on a substrate and configured to be displaced in response to an applied acceleration;
    a pair of electrode pads formed on said substrate such that the pair of electrode pads are disposed on respective sides of said thin film; and a nonconductive film covering a top surface of said thin film and the side of said thin film facing said electrode pads,
wherein a top surface of said conductive thin film is higher than top surfaces of said electrode pads.

2. The thin film structure as claimed in claim 1, wherein said nonconductive film covers sides and top edge portions of said electrode pads.

3. The thin film structure as claimed in claim 2, wherein said thin film and each electrode pad are spaced apart by the smallest possible spacing determined by the patterning accuracy.

4. The thin film structure as claimed in claim 1, wherein said thin film and each electrode pad are spaced apart by the smallest possible spacing determined by the patterning accuracy.

5. The thin film structure as claimed in claim 1, further comprising:
a nonconductive film pattern provided between said pair of electrode pads, wherein a top surface of said nonconductive film pattern is higher than said top surfaces of said electrode pads.

6. The thin film structure as claimed in claim 1, wherein the distance between said pair of electrode pads is 200 μm or more.

7. The thin film structure as claimed in claim 1, wherein the conductive thin film is formed of a silicon film, and
the pair of electrode pads is formed of a metal film.

* * * * *